United States Patent [19]
Adams

[11] Patent Number: 5,977,899
[45] Date of Patent: Nov. 2, 1999

[54] DIGITAL-TO-ANALOG CONVERTER USING NOISE-SHAPED SEGMENTATION

[75] Inventor: Robert W. Adams, Acton, Mass.

[73] Assignee: Analog Devices, Inc., Norwood, Mass.

[21] Appl. No.: 08/936,752

[22] Filed: Sep. 25, 1997

[51] Int. Cl.[6] ................................................. H03M 3/00
[52] U.S. Cl. ........................................... 341/145; 341/143
[58] Field of Search ................................... 341/143, 144, 341/145

[56] References Cited

U.S. PATENT DOCUMENTS

| | | | |
|---|---|---|---|
| 5,369,403 | 11/1994 | Temes et al. | 341/143 |
| 5,404,142 | 4/1995 | Adams et al. | 341/144 |
| 5,406,283 | 4/1995 | Leung | 341/143 |
| 5,684,482 | 11/1997 | Galton | 341/144 |

FOREIGN PATENT DOCUMENTS

WO98/48515   10/1998   WIPO .

OTHER PUBLICATIONS

X Xu et al, "The Implementation of Dual –Truncation Σ Δ D/A Converters," IFFF Circuits & Sys.J., 1992, 4 pp.

*Primary Examiner*—Howard L. Williams
*Attorney, Agent, or Firm*—Wolf, Greenfield & Sacks, P.C.

[57] ABSTRACT

A segmentation circuit includes a digital noise shaper responsive to a stream of digital input words for producing a stream of first digital subwords, and a subtractor for subtracting each of the first digital subwords from a corresponding one of the digital input words to produce a stream of second digital subwords that are noise-shaped. The first and second digital subwords have smaller word lengths than the digital input words. The sum of each of the first and second subwords is equal to the corresponding digital input word. When the digital input words are noise-shaped, the first and second digital subwords are both noise-shaped. The segmentation circuit may be used in a noise-shaping digital-to-analog converter having a multi-bit loop quantizer.

18 Claims, 8 Drawing Sheets

Fig. 7 ized noise-shaped word is first converted to a "thermometer code", where for an N-bit quantized word, $2^N$ equally-weighted elements are used. In the thermometer code, the number of output bits set to one is equal to the input value. The fact that the output bits are equally weighted allows dynamic mapping of digital input bits to analog elements of the digital-to-analog converter. By using an array of swapping elements whose state is controlled by the data itself, analog mismatch errors cause shaped noise to appear in the output spectrum. Therefore, most of the noise energy is outside the band of interest.

DIGITAL-TO-ANALOG CONVERTER USING NOISE-SHAPED SEGMENTATION

FIELD OF THE INVENTION

This invention relates to sigma delta digital-to-analog converters and, more particularly, to a digital-to-analog converter that utilizes a multi-bit quantizer and noise-shaped segmentation of the multi-bit words.

BACKGROUND OF THE INVENTION

Recently, sigma delta, or noise-shaping, analog-to-digital and digital-to-analog converters have come into widespread use. This type of converter uses a relatively coarse quantizer, usually a single bit, embedded in a feedback loop. The feedback loop causes the large quantization noise of the quantizer to become shaped in the frequency domain such that the noise over a small range of the spectrum is very low. The out-of-band noise is then removed by a digital filter in the case of an analog-to-digital converter, or an analog filter in the case of a digital-to-analog converter. Sigma delta converters exhibit excellent linearity and low quantization noise.

While early noise-shaping converters commonly used a one bit quantizer, multi-bit loop quantizers have recently received considerable attention. A multi-bit loop quantizer improves the performance of a sigma delta converter very significantly, especially with respect to signal-to-noise ratio, for a given oversampling ratio. The most serious drawback to multi-bit noise-shaping converters is that the matching of analog bit weights affects the linearity of the converter. The matching must be as good as the desired resolution of the converter. For example, a true 16-bit converter would require analog component matching to one part in $2^{16}$. Thus, one of the most important advantages of noise-shaping converters, namely that there is no requirement for precise analog component matching, is lost.

U.S. Pat. No. 5,404,142, issued Apr. 4, 1995 to Adams et al, discloses a noise-shaped scrambling technique that relieves the burden of tight analog component matching. The quantized noise-shaped word is first converted to a "thermometer code", where for an N-bit quantized word, $2^N$ equally-weighted elements are used. In the thermometer code, the number of output bits set to one is equal to the input value. The fact that the output bits are equally weighted allows dynamic mapping of digital input bits to analog elements of the digital-to-analog converter. By using an array of swapping elements whose state is controlled by the data itself, analog mismatch errors cause shaped noise to appear in the output spectrum. Therefore, most of the noise energy is outside the band of interest.

In this prior art technique, the required number of swapper cells is proportional to $(M/2)*LOG_2(M)$ where $M=2^N$, N being the number of bits used in the noise-shaping quantizer. For example, when a 4-bit word is converted to a 16-level thermometer code, the number of swapper cells is 8·4=32.

In many cases, it is desirable to use a large number of bits in the loop quantizer of the sigma delta converter. For example, using a larger number of bits in a digital-to-analog converter results in a smaller amount of out-of-band quantization noise. This in turn relaxes the requirement on the analog low pass filter that follows the converter. Unfortunately, using a large number of bits in the loop quantizer causes the area and power of the circuit, typically implemented as a monolithic integrated circuit, to grow to impractical levels. For example, a 6-bit loop quantizer would require a thermometer encoder having 64 output bits and a 64 element digital-to-analog converter, each of the elements being a capacitor, a current source or a voltage source.

Accordingly, it is desirable to provide a noise-shaping converter using a multi-bit quantizer, wherein the above drawbacks are alleviated.

SUMMARY OF THE INVENTION

According to a first aspect of the invention, a segmentation circuit is provided. The segmentation circuit comprises a digital noise shaper responsive to a stream of digital input words for producing a stream of first digital subwords, and a subtractor for subtracting each of the first digital subwords from a corresponding one of the digital input words to produce a stream of second digital subwords that are noise-shaped. The first and second digital subwords have smaller word lengths than the digital input words. The sum of each of the first and second subwords is equal to the corresponding digital input word. When the digital input words are noise-shaped, the first and second digital subwords are both noise-shaped. The segmentation circuit may be used in a noise-shaping digital-to-analog converter having a multi-bit loop quantizer.

According to another aspect of the invention, a digital-to-analog converter is provided. The digital-to-analog converter includes a segmentation circuit, as described above, which receives digital inputs words and provides first and second digital subwords. The converter further comprises a first digital-to-analog converter circuit for converting each of the first digital subwords to a first analog value, a second digital-to-analog converter circuit for converting each of the second digital subwords to a second analog value, and a summing circuit for summing each of the first and second analog values to produce an analog output that represents the stream of digital input words. The first and second digital-to-analog converter circuits produce the first and second analog values, respectively, in proportion to the relative bit weights of the first and second digital subwords.

The first and second digital-to-analog converter circuits may each comprise a thermometer encoder for encoding each of the respective digital subwords to a set of equally-weighted binary bits, a scrambler for scrambling the equally-weighted binary bits to produce scrambled binary bits and a digital-to-analog converter for producing the respective analog value in response to the scrambled binary bits. Each digital-to-analog converter has equally-weighted inputs.

According to another aspect of the invention, a method for segmenting a stream of digital input words is provided. The method comprises the steps of noise-shaping a stream of digital input words and producing a stream of first digital subwords, and subtracting each of the first digital subwords from a corresponding one of the digital input words and producing a stream of second digital subwords that are noise-shaped. The first and second digital subwords have smaller word lengths than the digital input words. The sum of each of the first and second digital subwords is equal to the corresponding digital input word. When the digital input words are noise-shaped, the first and second digital subwords are both noise-shaped.

According to a further aspect of the invention, the segmentation circuit described above may be used in a tree structure. The process of segmenting a digital input word into two noise-shaped subwords having smaller word lengths is repeated in the tree structure. The tree structure may have two or more levels of segmentation. At every level in the tree structure, the word length is reduced. Thus, a first segmentation circuit may have second and third segmentation circuits coupled to its outputs in a tree structure.

According to yet another aspect of the invention, a sigma delta modulator is provided. The sigma delta modulator comprises a summing unit for subtracting a feedback signal from an input signal and providing a summing unit output, a loop filter for receiving the summing unit output and providing a filter output signal, an n-bit flash analog-to-digital converter for providing an n-bit output signal in response to the filter output signal, and an n-bit digital-to-analog converter responsive to the n-bit output signal for providing the feedback signal to the summing unit. The n-bit digital-to-analog converter may have the structure described above, including at least one segmentation circuit.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
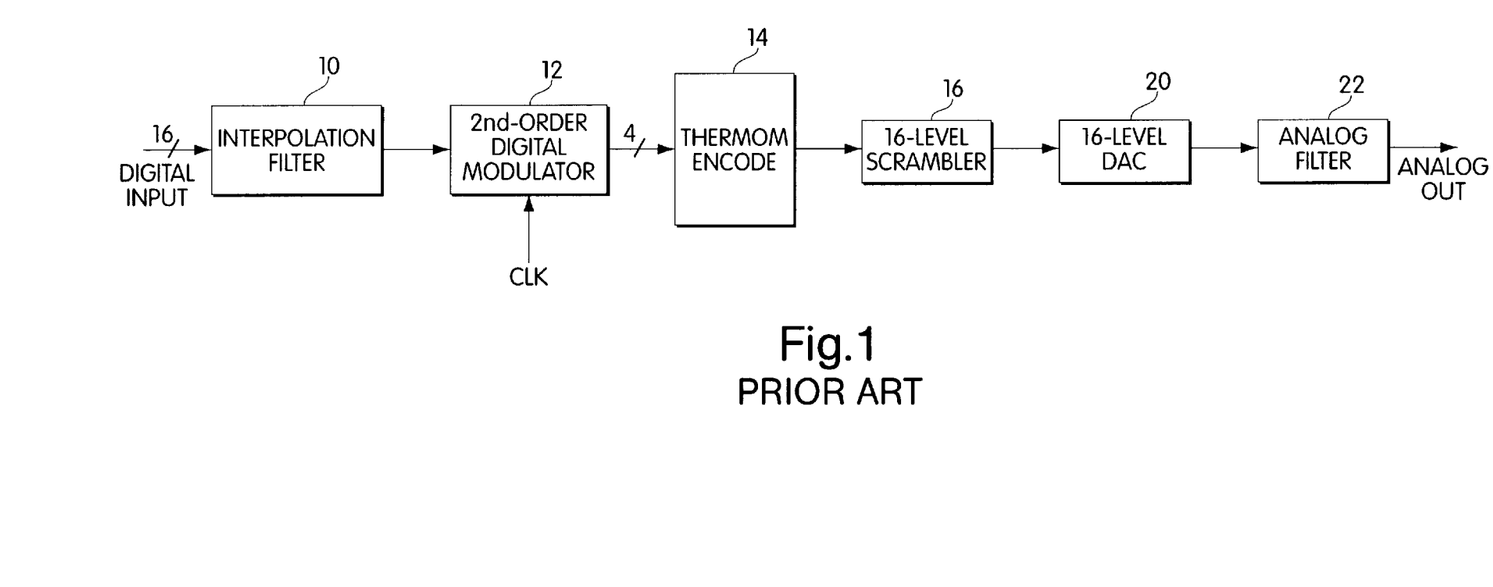
FIG. 1 is a block diagram of a prior art noise-shaped digital-to-analog converter utilizing scrambling for frequency shaping of analog mismatch errors.

A block diagram of a prior art digital-to-analog converter (DAC) system using scrambling is shown in FIG. 1. A digital interpolation filter 10 and a digital modulator 12, or noise shaper, are used to convert the input data, which is typically 16–20 bits in length in an audio application, to a smaller number N of binary-weighted bits, typically 1–4 bits, at a higher word rate, typically 64–256 times higher than the original input sampling rate. The output of the digital modulator 12 is supplied to a thermometer encoder 14 that converts the N binary-weighted bits into M equally-weighted bits, where M equals $2^N$. The equally-weighted bits are passed through a scrambler 16 and are then applied to a digital-to-analog converter 20 having equally-weighted analog elements that sum the outputs of the scrambler 16 to form an analog signal. The analog elements may be switched capacitors that deliver packets of charge, switched currents, or switched voltages that are summed with resistors. The digital-to-analog converter 20 is followed by an analog low pass filter 22 which removes the out-of-band noise produced by the digital modulator 12.

Figure 1A:
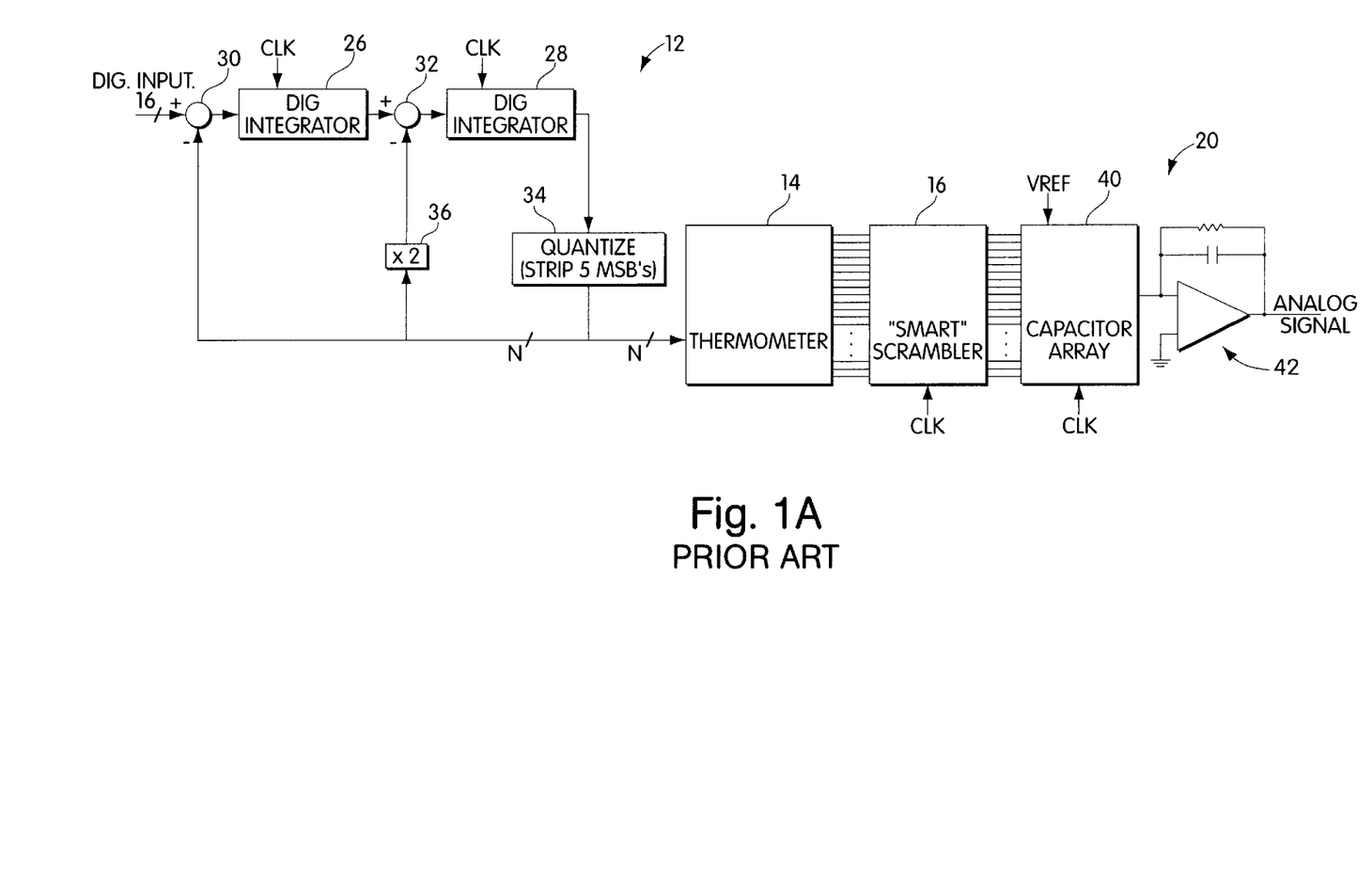
FIG. 1A is a block diagram showing a part of the digital-to-analog converter of FIG. 1 in more detail.

The digital-to-analog converter system of FIG. 1, except for interpolation filter 10 and analog filter 22, is shown in more detail in FIG. 1A. Like elements in FIGS. 1 and 1A have the same reference numerals. In the example of FIG. 1A, digital modulator 12 includes digital integrators 26 and 28, summing circuits 30 and 32, a multiplier 36 and a multi-bit quantizer 34 in a second order multi-bit loop configuration. The digital modulator 12 provides a stream of N-bit noise-shaped digital words to the thermometer encoder 14, which outputs $2^N$ equally-weighted bits to scrambler 16. The scrambler 16 provides $2^N$ scrambled bits to a capacitor array 40 of digital-to-analog converter 20. The capacitor array 40 includes equally-weighted switched capacitors which supply charge packets to an amplifier 42. The amplifier 42 outputs an analog signal.

As indicated above, it is desirable to use a large number of bits in the digital modulator to reduce the filtering requirements of the analog filter 22, as well as to increase the signal-to-noise ratio and thereby increase the dynamic range. This causes the required circuit area and power consumption to increase and is not practical in the converter system of FIGS. 1 and 1A. For example, a converter having a 6-bit loop quantizer requires 64 elements in the capacitor array 40 and 192 swapper cells in the scrambler 16.

Figure 2:
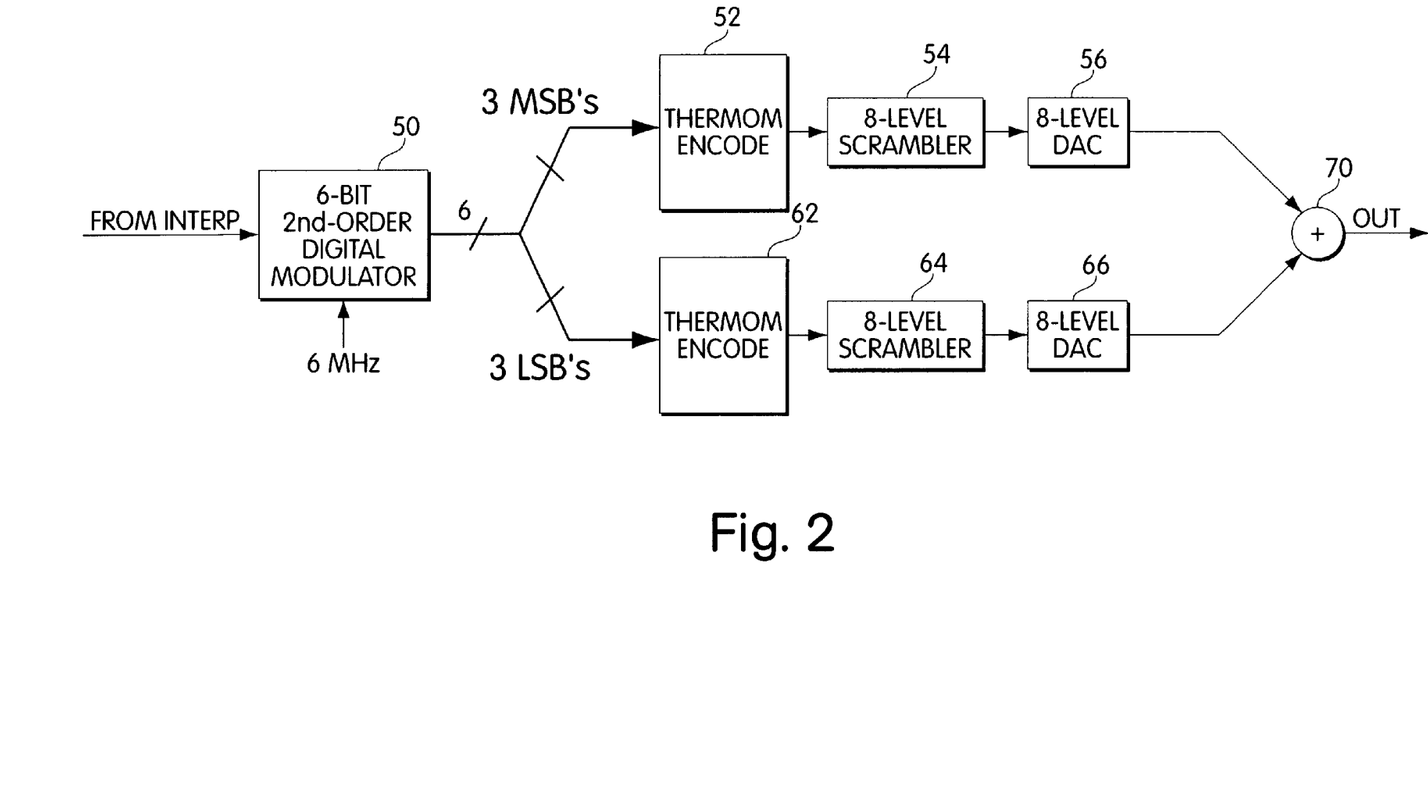
FIG. 2 is a block diagram of a digital-to-analog converter utilizing simple bit splitting of the digital modulator output.

The number of analog elements and swapper cells may be reduced by using two or more sub-DACs instead of a single DAC with $2^N$ levels. Each sub-DAC has its own thermometer encoder, and the analog weights for each sub-DAC are different, as shown in the example of FIG. 2. A 6-bit word from a digital modulator 50 may be split into the three most significant bits (MSBs) and the three least significant bits (LSBs). The three MSBs are converted by a thermometer encoder 52 into 8 equally-weighted bits, which pass through a scrambler 54 and drive an 8-level DAC 56. The three LSBs are converted by a thermometer encoder 62 into 8 equally-weighted bits, which pass through a scrambler 64 and drive an 8-level DAC 66. The analog outputs of DAC 56 and DAC 66 are supplied to a summing circuit 70. The output of DAC 56 has bit weights of K, while the output of DAC 66 has bit weights of K/8. The output of summing circuit 70 is an analog value that equals the 6-bit digital input word. Only 16 analog elements are required, as compared with 64 elements required in the converter of FIGS. 1 and 1A.

Unfortunately, the circuit of FIG. 2 has a major flaw. While errors in the DACs 56 and 66 are noise-shaped as a result of using the scramblers 54 and 64, errors that result from gain mismatches between the two DACs are not noise-shaped and therefore produce in-band noise. This may be explained as follows.

Figure 3A:
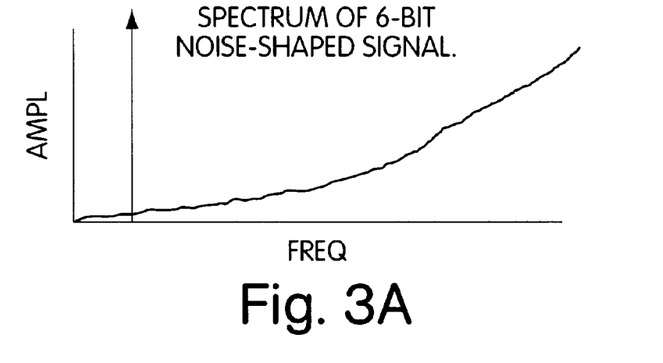
FIGS. 3A–3C illustrate the spectra of the noise-shaped modulator output, the MSB's and the LSB's, respectively, of the converter of FIG. 2.
Figure 3B:
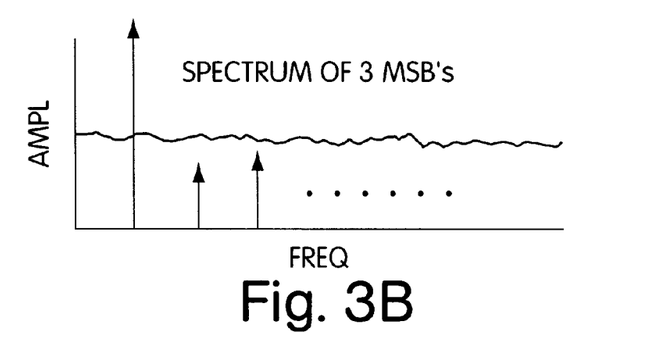
Figure 3C:
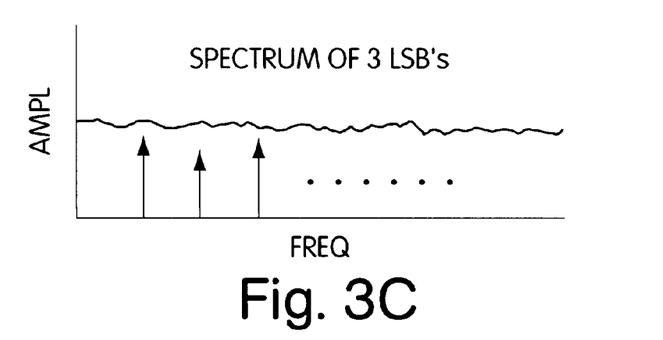

The spectrum of the 6-bit word output by digital modulator 50 is noise-shaped, as shown in FIG. 3A. When this 6-bit word is split into the three MSBs and the three LSBs, the spectrum of each of the three-bit words is not noise-shaped, but is likely to be a combination of distortion and white noise, as shown in FIGS. 3B and 3C. With no analog mismatch errors, the sum of the two 3-bit words is equal to the original 6-bit word, which is again noise-shaped. However, in the presence of gain errors between the two 8-level DACs 56 and 66, the spectrum of the error that results from this gain mismatch is simply the spectrum of each of the individual 3-bit words, which is not noise-shaped.

In order to overcome this problem, the original noise-shaped word output by digital modulator 50 is split, or segmented, into two components with smaller word lengths, where the two components meet the following criteria: (a) the sum of the two components must be equal to the original noise-shaped word; and (b) the spectrum of at least one of the components must be noise-shaped, so that in the presence of gain errors between the two DACs, the error is also noise-shaped.

Figure 4:
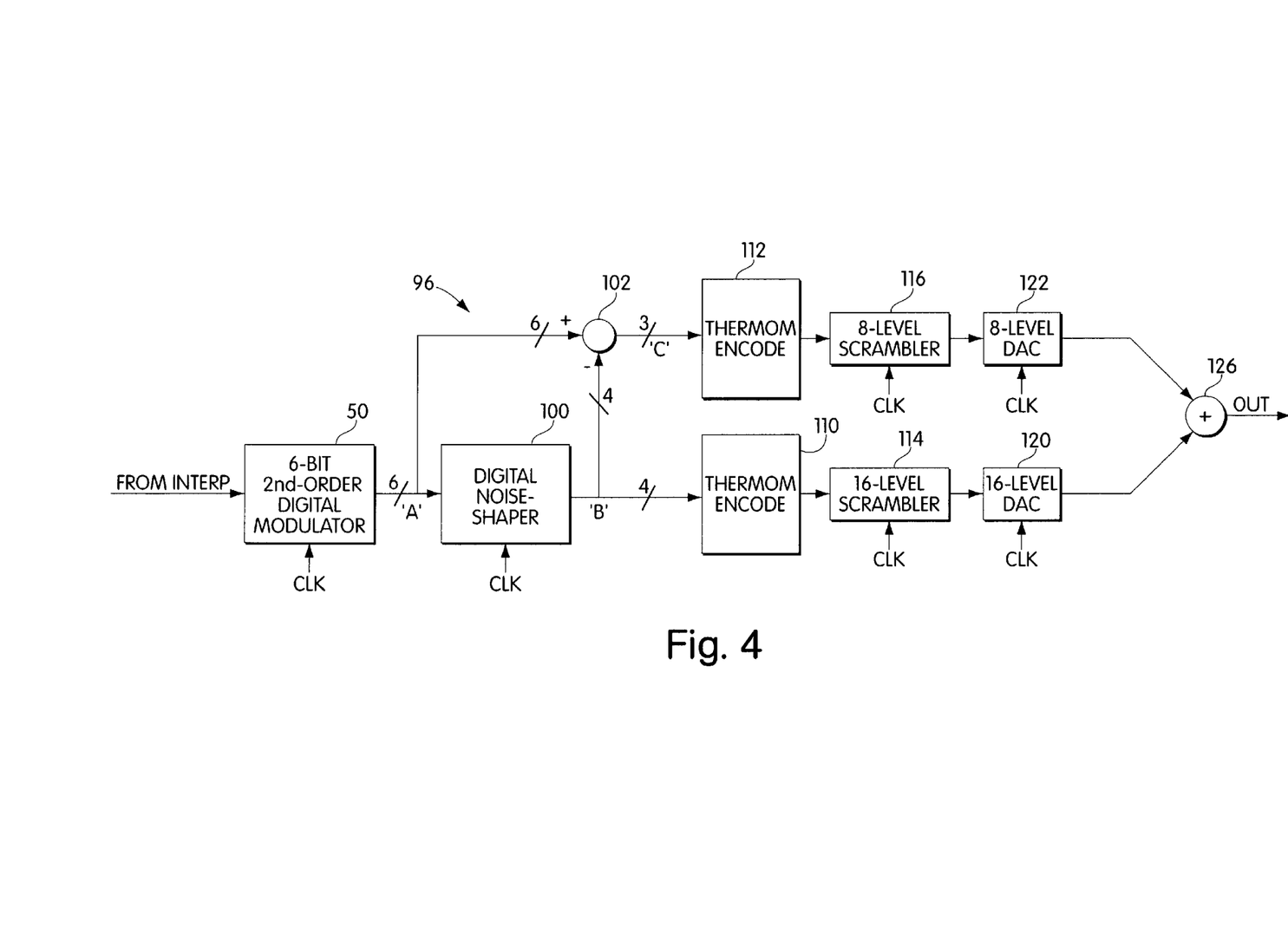
FIG. 4 is a block diagram of a digital-to-analog converter using noise-shaped segmentation in accordance with the present invention.

A block diagram of a digital-to-analog converter that meets the above requirements is shown in FIG. 4. The output of digital modulator 50, a noise-shaped digital input word A, is applied to a segmentation circuit 96, including a digital noise shaper 100 and a subtractor 102, that splits, or segments, the digital input word A into subwords B and C. The digital input words A are applied to digital noise-shaper 100, which reduces the word length of the input words A and produces noise-shaped digital subwords B. The error introduced by the word length reduction is noise-shaped rather than white. A second digital subword C is produced by subtracting subword B from input word A in subtractor 102. The subword C equals A−B, and B+C=A. The digital subword B is MSB aligned with the digital input word A in the subtractor 102, with the two low order bits of the subword B input to subtractor 102 set to logic zero. Since the subword B tracks the input word A, the subword C is small and has fewer bits than the original input word A. Since input words A are noise-shaped, subwords B and C are noise-shaped. The circuit of FIG. 4 therefore meets the requirements specified above. The subwords B and C are both noise-shaped and have smaller word lengths than input word A, and their sum equals the original input word A.

Referring again to FIG. 4, subword B is applied to a thermometer encoder 110, and subword C is applied to a thermometer encoder 112. In the example of a 6-bit input word A, subword B has 4 bits and subword C has 3 bits, as described below. Thus, thermometer encoder 110 supplies 16 equally-weighted bits to a 16-level scrambler 114, and thermometer encoder 112 supplies eight equally-weighted bits to an 8-level scrambler 116. The scrambled bits output by scrambler 114 are applied to a 16-level DAC 120, and the scrambled bits output by scrambler 116 are supplied to an 8-level DAC 122. The analog outputs of DAC 120 and DAC 122 are supplied to a summing circuit 126. The output of DAC 120 has bit weights of K, while the output of DAC 122 has bit weights of K/14. The output of summing circuit 126 has an analog value that represents input digital word A. Additional details regarding the structure and operation of the thermometer encoder and the scrambler are provided in the aforementioned U.S. Pat. No. 5,404,142, which is hereby incorporated by reference.

The segmentation circuit 96, including digital noise-shaper 100 and subtractor 102, thus receives digital input words A and produces subwords B and C. The subwords B and C have smaller word lengths than input word A. The sum of subwords B and C is equal to input word A. When input words A are noise-shaped, subwords B and C are also noise-shaped. It will be understood that the segmentation circuit may be configured for operation with any input word length. Thus, the input word length may be more than 6 bits or less than 6 bits. The word lengths of subwords B and C depend on the application, but subwords B and C preferably have approximately equal word lengths to minimize circuit area. The relative bit weights of DAC 120 and DAC 122, in general, depend on the word lengths of input words A and subwords B. Where input word A has J bits and subword B has K bits, DAC 120 has bit weights of $2^{J-K}$ relative to DAC 122.

In the case shown in FIG. 4 and described above, input words A are noise-shaped, and subwords B and C are also noise-shaped. In a second case within the scope of the invention, input words A are not noise-shaped, and, as a result, subwords C (equal to the error between input word A and subword B) are noise-shaped and subwords B are not noise-shaped. In each case, the error that results from gain mismatch between DACs 120 and 122 is noise shaped. Thus, the segmentation circuit 96 produces the desired result whether or not input words A are noise-shaped.

The subword C is formed by subtracting subword B from input word A, with subword B MSB aligned with input word A. The word length of subword C is found to be 3 bits in the example where input word A has 6 bits and subword B has 4 bits. Thus, a 6-bit word is split into 4-bit noise-shaped subword B and 3-bit noise-shaped subword C. The fact that the total number of bits at the output is one greater than the total number of input bits means that there is overlap between the least significant DAC 122 and the most significant DAC 120. The full scale range of the least significant DAC 122 is twice the value of the LSB of the most significant DAC 120. This occurs because the noise-shaper 100 that receives input word A and produces subword B introduces noise-shaped errors up to ± four LSBs of the original input word A. When subword B is then subtracted from input word A, one bit of word growth occurs during the subtraction that would not occur if the subword B were simply the 4 high order bits of input word A. In other words, the penalty that is paid for insisting that subwords B and C be individually noise-shaped is that there is one bit of word growth in subword C.

Even with this word growth, the reduction in the number of scrambling elements is substantial. Using the configuration of FIG. 1, the number of scrambler elements for the 6-bit input word is 192. The total number of scrambler elements for the configuration of FIG. 4 is 44. Thus, the number of required scrambler elements is reduced by a factor of more than four.

Figure 5:
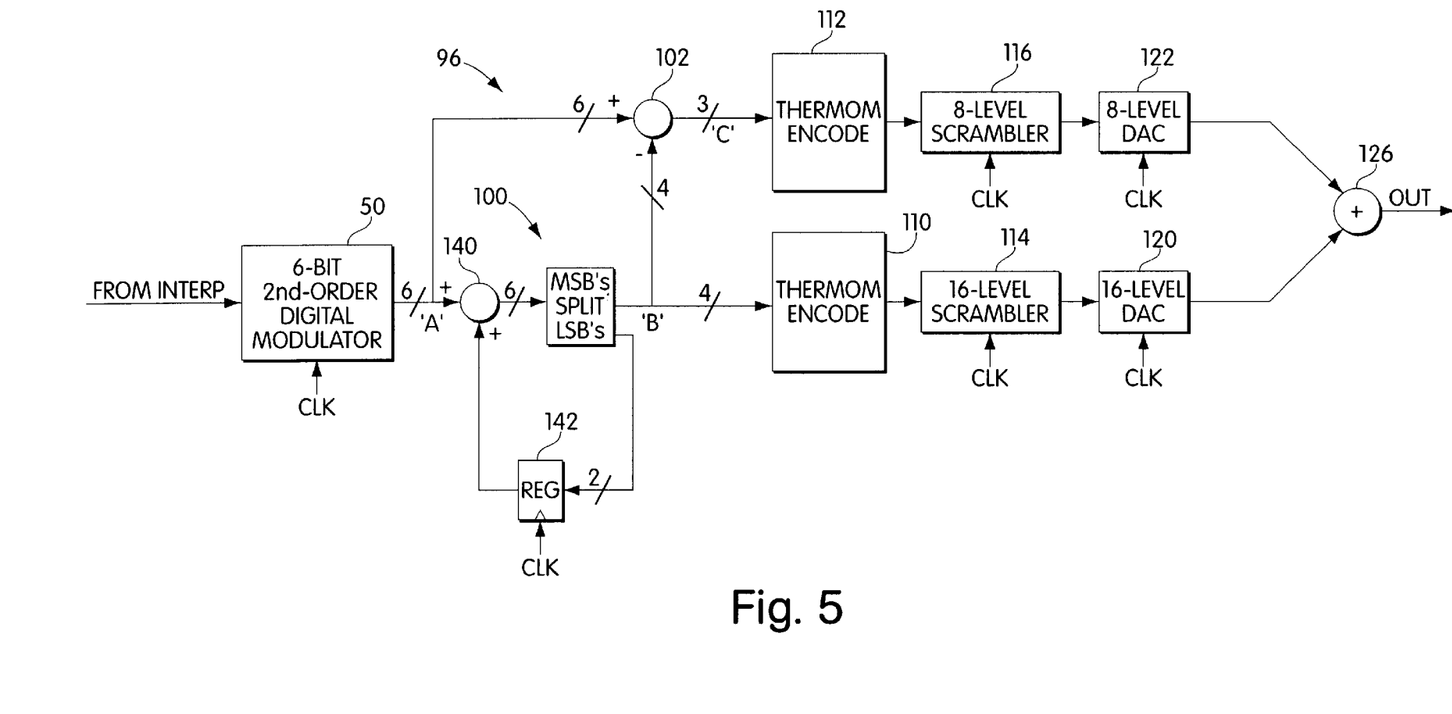
FIG. 5 is a block diagram of the digital-to-analog converter of FIG. 4, showing the digital noise shaper in more detail.

A more detailed block diagram of the converter of FIG. 4 is shown in FIG. 5. Like elements in FIGS. 4 and 5 have the same reference numerals. The digital modulator 50 may run at a clock rate that is 128 times the final desired output bandwidth. The digital noise-shaper 100 may be a simple first order noise-shaper, which utilizes a simple residue recirculation scheme, as shown in FIG. 5. The 6-bit input word A passes through a summing circuit 140 and is split into the upper four most significant bits and the two least significant bits. The two least significant bits are supplied to a clocked register 142, and are added to the input word A by the summing circuit 140 on the next clock cycle. The four most significant bits constitute the subword B. This configuration of the digital noise-shaper 100 is well known by those skilled in the art to produce first order noise-shaping and is not described in further detail. Other digital noise shaper circuits may be used within the scope of the invention.

Figure 6:
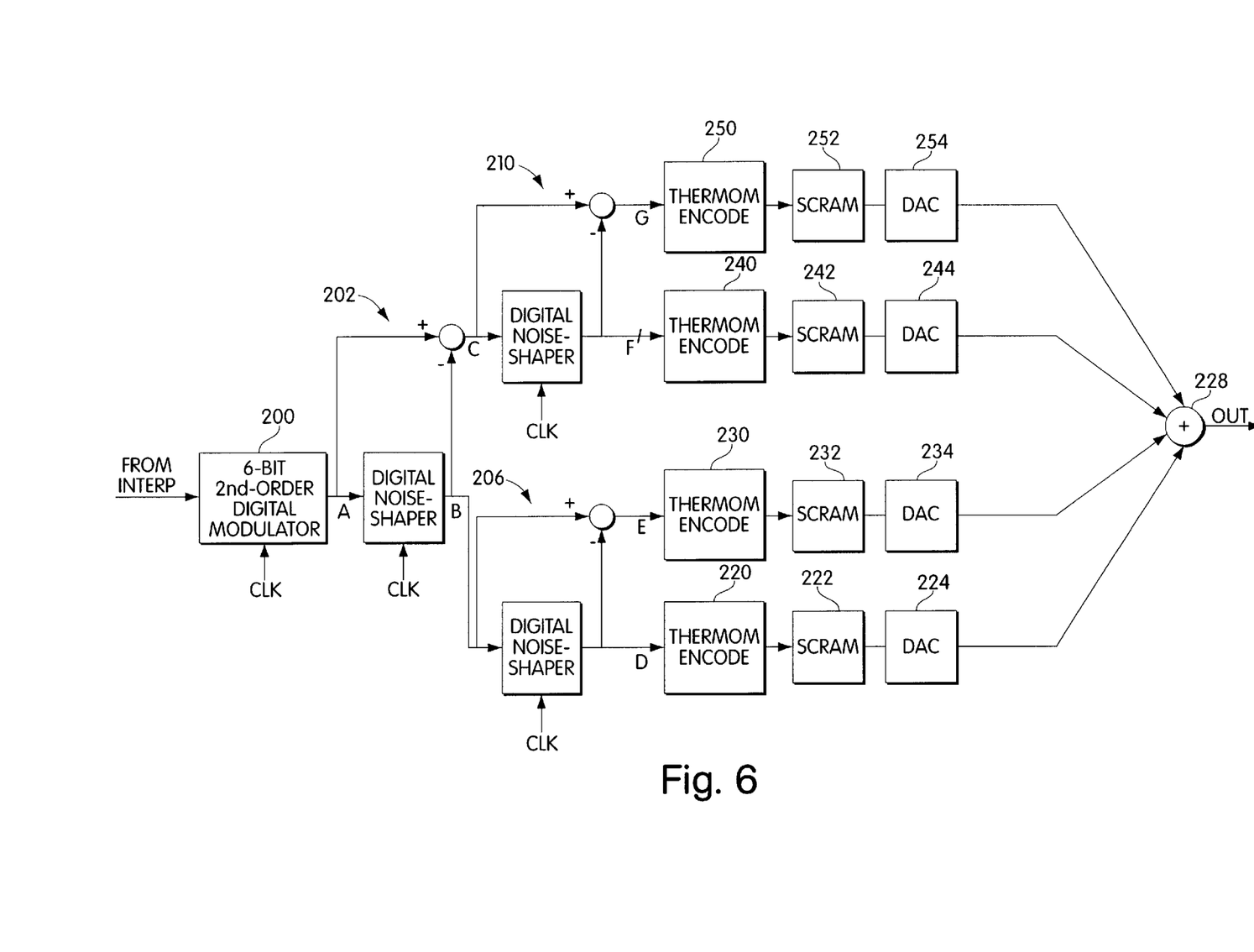
FIG. 6 is a block diagram of a digital-to-analog converter using noise-shaped segmentation in a tree structure.

In the example of FIGS. 4 and 5, the input word is split into two noise-shaped subwords. For large input words, it may be advantageous to split the input word into more than two subwords using a tree structure, as shown in FIG. 6. The process of segmenting a digital word into two smaller noise-shaped subwords is repeated in the tree structure. The tree structure may have two or more levels of segmentation. At every level in the tree structure, the number of bits is reduced. The final results are supplied to a plurality of small sub-DACs.

Referring to FIG. 6, an input digital word A generated by a digital modulator 200 is applied to a first segmentation circuit 202. Segmentation circuit 202 segments the input word A into an intermediate subword B and intermediate subword C. Intermediate subword B is applied to a segmentation circuit 206, and intermediate subword C is applied to a segmentation circuit 210. Segmentation circuit 206 further segments intermediate subword B into subwords D and E. Segmentation circuit 210 further segments intermediate subword C into subwords F and G. Subword D is processed by a DAC circuit, including a thermometer encoder 220, a scrambler 222 and a DAC 224, and a first analog value is supplied to a summing circuit 228. Subword E is processed by a DAC circuit, including a thermometer encoder 230, a scrambler 232 and a DAC 234, and a second analog value is supplied to summing circuit 228. Subword F is processed by a DAC circuit, including a thermometer encoder 240, a scrambler 242 and a DAC 244, and a third analog value is supplied to summing circuit 228. Subword G is processed by a DAC circuit, including a thermometer encoder 250, a scrambler 252 and a DAC 254, and a fourth analog value is supplied to summing circuit 228. An analog output of summing circuit 228, the sum of the first, second, third and fourth analog values, represents input digital word A. The DACs 224, 234, 244 and 254 have bit weights that correspond to the relative bit weights of the respective channels. Each of the segmentation circuits 202, 206 and 210 includes a digital noise-shaper and a subtractor, and functions as described above in connection with the segmentation circuit 96, with appropriate adjustment of input and output word lengths.

The tree structure of FIG. 6 has two levels of segmentation. It will be understood that the tree structure may have any desired number of levels of segmentation.

Figure 7:
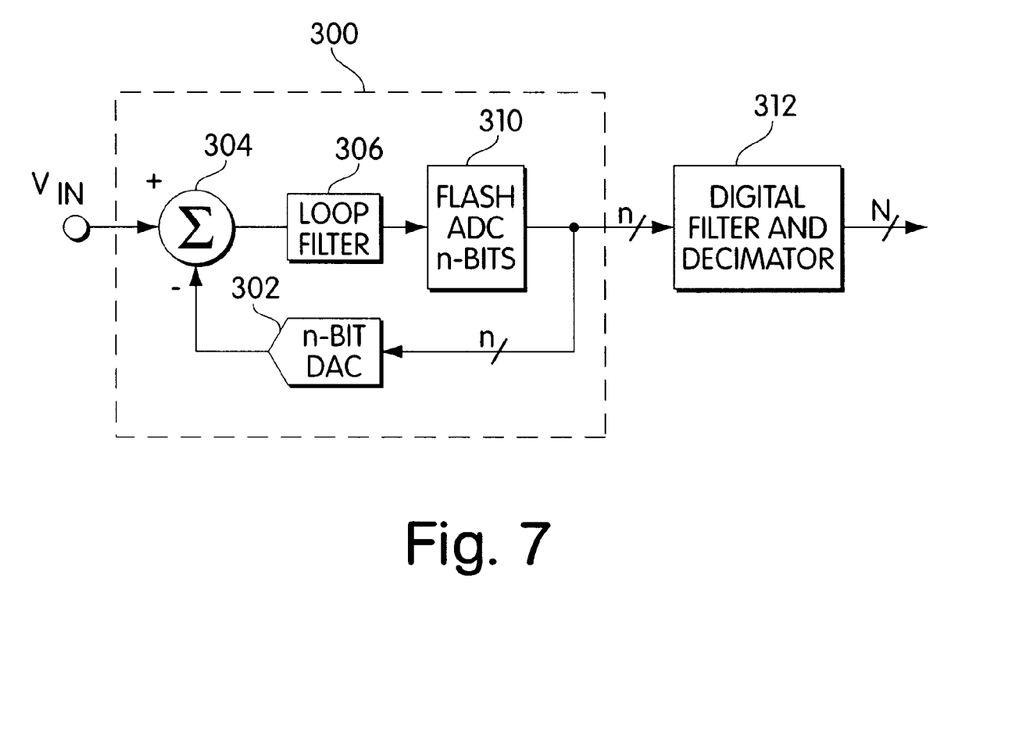
FIG. 7 is a block diagram of an analog-to-digital converter utilizing a digital-to-analog converter in accordance with the invention.

The digital-to-analog converters shown in FIGS. 4–6 and described above may be used to implement a sigma delta analog-to-digital converter as shown in FIG. 7. A sigma delta modulator 300 converts an analog input signal into n-bit data words at a rate determined by a sampling clock. An n-bit DAC 302 is driven by the serial output data stream to generate a feedback signal. The n-bit DAC 302 may correspond to the circuitry following the digital modulator 50 in FIG. 4, or the circuitry following the digital modulator 200 in FIG. 6, and variations thereof as described herein. The output of DAC 302 is subtracted from the input signal in a summing unit 304. Typically, the summing unit 304 is implemented as a summing junction of an operational amplifier. A loop filter 306 filters the output of summing unit 304, and the output of loop filter 306 is applied to an n-bit flash analog-to-digital converter 310. The output of flash ADC 310 is applied to a digital filter and decimator 312. The decimator reduces the effective sampling rate at the output.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A segmentation circuit comprising:
   a digital noise shaper responsive to a stream of digital input words for producing a stream of first digital subwords; and
   a subtractor for subtracting each of said first digital subwords from a corresponding one of said digital input words to produce a stream of second digital subwords that are noise-shaped, wherein said first and second digital subwords have smaller word lengths than said digital input words and wherein the sum of each of said first and second digital subwords is equal to the corresponding digital input word.

2. A segmentation circuit as defined in claim 1 wherein said digital input words are noise-shaped, and said first and second digital subwords are noised-shaped.

3. A segmentation circuit as defined in claim 1 wherein the most significant bit of each of said digital input words is aligned with the most significant bit of each of said first digital subwords in said subtractor.

4. A segmentation circuit as defined in claim 1 wherein said digital noise shaper comprises a summer for summing each of said digital input words with an error signal and producing a sum output on a current clock cycle, and a register receiving low order bits of said sum output on the current clock cycle and providing said error signal to said summer on a next clock cycle, high order bits of said sum output constituting said first digital subword.

5. A digital-to-analog converter comprising:
   a segmentation circuit comprising:
      a digital noise shaper responsive to a stream of digital input words for producing a stream of first digital subwords; and
      a subtractor for subtracting each of said first digital subwords from a corresponding one of said digital input words to produce a stream of second digital subwords, wherein the sum of said first and second digital subwords is equal to the corresponding digital input word and wherein said first and second digital subwords have smaller word lengths than said digital input words;
   a first digital-to-analog converter circuit for converting each of said first digital subwords to a first analog value;
   a second digital-to-analog converter circuit for converting each of said second digital subwords to a second analog value, said first and second digital-to-analog converter circuits producing said first and second analog values, respectively, in proportion to the relative bit weights of said first and second digital subwords; and
   a summing circuit for summing each of said first and second analog values to produce an analog output that represents said stream of digital input words.

6. A digital-to-analog converter as defined in claim 5 wherein said digital noise shaper comprises a summer for summing each of said digital input words with an error signal and producing a sum output on a current clock cycle, and a register receiving low order bits of said sum output on the current clock cycle and providing said error signal to said summer on a next clock cycle, high order bits of said sum output constituting said first digital subword.

7. A digital-to-analog converter as defined in claim 5 wherein said first and second digital-to-analog converter circuits each comprise:
   a thermometer encoder for encoding each of the respective digital subwords to a set of equally-weighted binary bits;
   a scrambler for scrambling said equally-weighted binary bits to produce scrambled binary bits; and
   a digital-to-analog converter having equally-weighted inputs for producing the respective analog value in response to said scrambled binary bits.

8. A digital-to-analog converter as defined in claim 7 wherein said scrambler includes means for data-dependent scrambling of said equally-weighted binary bits.

9. A digital-to-analog converter as defined in claim 7 wherein the most significant bit of each of said digital input words is aligned with the most significant bit of each of said first digital subwords in said subtractor.

10. A digital-to-analog converter as defined in claim 7 further comprising a digital sigma delta modulator for generating said stream of digital input words from a stream of digital input values.

11. A digital-to-analog converter as defined in claim 7 further comprising an analog low pass filter coupled to an output of said summing circuit.

12. A digital-to-analog converter as defined in claim 5 wherein said digital input words are noise-shaped.

13. A method for segmenting a stream of digital input words, comprising the steps of:

noise-shaping the stream of digital input words and producing a stream of first digital subwords; and subtracting each of said first digital subwords from a corresponding one of said digital input words and producing a stream of second digital subwords that are noise-shaped, wherein said first and second digital subwords have smaller word lengths than said digital input words and wherein the sum of each of said first and second digital subwords is equal to the corresponding digital input word.

14. A method as defined in claim 13, wherein the step of subtracting includes aligning the most significant bit of each of said digital input words with the most significant bit of each of said first digital subwords.

15. A segmentation tree structure comprising:

a first segmentation circuit having an input for receiving a stream of digital input words, a first output for providing a stream of first intermediate subwords and a second output for providing a stream of second intermediate subwords;

a second segmentation circuit having an input coupled to the first output of said first segmentation circuit for receiving said stream of first intermediate subwords, a first output for providing a stream of first output subwords and a second output for providing a stream of second output subwords;

a third segmentation circuit having an input coupled to the second output of said first segmentation circuit for receiving said stream of second intermediate subwords, a first output for providing a stream of third output subwords and a second output for providing a stream of fourth output subwords;

said first, second and third segmentation circuits each comprising: a digital noise shaper coupled between said input and said first output, and a subtractor having a first input coupled to the input of the respective segmentation circuit, a second input coupled to the first output of the respective segmentation circuit and an output coupled to the second output of the respective segmentation circuit;

wherein the sum of each of said first, second, third and fourth output subwords is equal to the corresponding input word and wherein said first, second, third and fourth output subwords are noise-shaped when said input words are noise-shaped.

16. A segmentation tree structure as defined in claim 15, wherein the digital noise shaper of each of said first, second and third segmentation circuits comprises a summer for summing an input signal with an error signal and producing a sum output on a current clock cycle, and a register receiving low order bits of said sum output on the current clock cycle and providing said error signal to said summer on a next clock cycle.

17. A sigma delta modulator comprising:

a summing unit for subtracting a feedback signal from an input signal and providing a summing unit output;

a loop filter for receiving said summing unit output and providing a filter output signal;

a flash analog-to-digital converter for providing a digital output of n bits in response to said filter output signal; and a digital-to-analog converter responsive to said digital output for providing said feedback signal to said summing unit, said digital output comprising a stream of digital input words to said digital-to-analog converter, said digital-to-analog converter comprising:

a segmentation circuit comprising:

a digital noise shaper responsive to said stream of digital input words for producing a stream of first digital subwords; and a subtractor for subtracting each of said first digital subwords from a corresponding one of said digital input words to produce a stream of second digital subwords, wherein the sum of said first and second digital subwords is equal to the corresponding digital input word and wherein said first and second digital subwords have smaller word lengths than said digital input words;

a first digital-to-analog converter circuit for converting each of said first digital subwords to a first analog value;

a second digital-to-analog converter circuit for converting each of said second digital subwords to a second analog value, said first and second digital-to-analog converter circuits producing said first and second analog values, respectively, in proportion to the relative bit weights of said first and second digital subwords; and a summing circuit for summing each of said first and second analog values to produce an analog output that represents said stream of digital input words.

18. A sigma delta modulator as defined in claim 17, wherein said first and second digital-to-analog converter circuits each comprise:

a thermometer encoder for encoding each of the respective digital subwords to a set of equally-weighted binary bits;

a scrambler for scrambling said equally-weighted binary bits to produce scrambled binary bits; and a digital-to-analog converter having equally-weighted inputs for producing the respective analog value in response to said scrambled binary bits.

\* \* \* \* \*